(12) United States Patent
Eriksson

(10) Patent No.: US 7,377,787 B1
(45) Date of Patent: May 27, 2008

(54) TABBED CIRCUIT BOARD AND METHOD FOR MANUFACTURING SAME

(75) Inventor: Eric O. Eriksson, Glenview, IL (US)

(73) Assignee: iLight Technologies, Inc., Chicago, IL (US)

( * ) Notice: Subject to any disclaimer, the term of this patent is extended or adjusted under 35 U.S.C. 154(b) by 0 days.

(21) Appl. No.: 11/626,411

(22) Filed: Jan. 24, 2007

(51) Int. Cl.
*H01R 12/00* (2006.01)

(52) U.S. Cl. .................. 439/56; 439/77; 362/800
(58) Field of Classification Search .............. 439/56, 439/58, 77; 362/95, 227, 800, 240, 249
See application file for complete search history.

(56) References Cited

U.S. PATENT DOCUMENTS

| | | | |
|---|---|---|---|
| 6,592,238 B2 * | 7/2003 | Cleaver et al. | 362/249 |
| 6,851,832 B2 * | 2/2005 | Tieszen | 362/249 |
| 6,948,828 B1 * | 9/2005 | Chambers et al. | 362/219 |
| 6,953,262 B2 * | 10/2005 | Cleaver et al. | 362/219 |

* cited by examiner

*Primary Examiner*—Khiem Nguyen
(74) *Attorney, Agent, or Firm*—Stites & Harbison, PLLC; David W. Nagle, Jr.; Robert C. Yang

(57) ABSTRACT

A circuit board for receiving and operably connecting a plurality of electrical components generally comprises: a flexible substrate of a predetermined length and having a first lateral edge and a second lateral edge; a conductive trace applied to the flexible substrate; and a plurality of integral tabs arrayed along the first lateral edge, one or more electrical components being operably connected to the conductive trace at a respective tab, and wherein each tab can be manipulated from a first position in which the tab is aligned with the remainder of the substrate to a second position in which the tab is oriented at an angle relative to the remainder of the substrate.

8 Claims, 2 Drawing Sheets

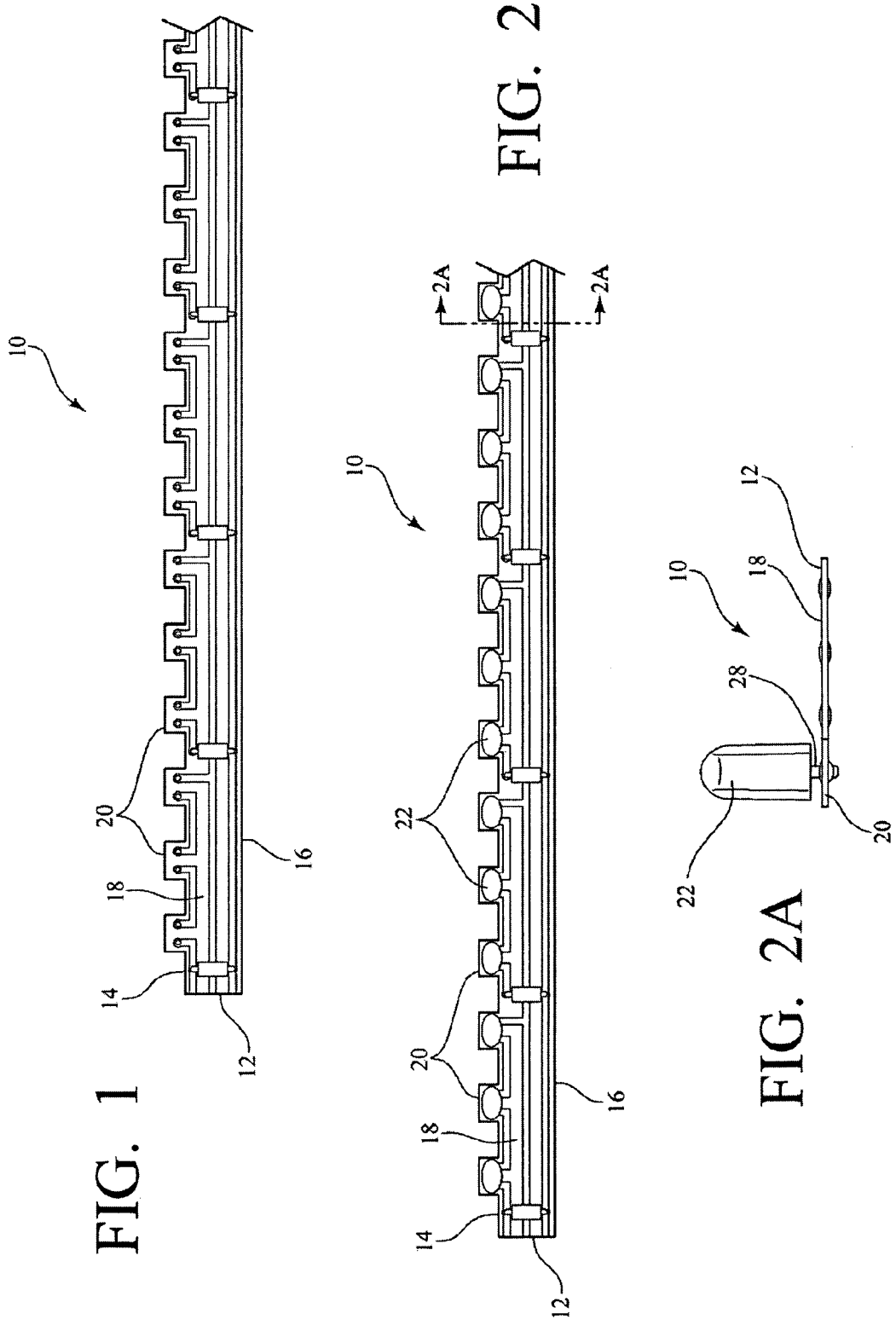

US 7,377,787 B1

TABBED CIRCUIT BOARD AND METHOD FOR MANUFACTURING SAME

BACKGROUND OF THE INVENTION

The present invention is a tabbed circuit board populated with electrical components and method for manufacturing same.

Light-emitting diodes (LEDs) are useful in various lighting applications. Since the development of LEDs, many attempts have been made to utilize them in innovative ways. For example, U.S. Pat. Nos. 6,592,238 and 6,953,262, which are incorporated herein by this reference, each describe the use of LEDs in an illumination device to simulate neon lighting. The use of LEDs offer many advantages compared with neon lighting including, for example, better durability and reduced costs. As described in U.S. Pat. Nos. 6,592,238 and 6,953,262, a circuit board is typically populated with LEDs and placed in a housing adjacent the light-receiving surface of a rod-like member or waveguide. The rod-like member/waveguide is made of a material that preferentially scatters light entering the light-receiving surface such that the light intensity pattern exiting a light-emitting surface of the rod-like member/waveguide is substantially uniform.

In many cases, it is desirable to have a particular compact configuration for such an illumination device, i.e., a low-profile illumination device. Accordingly, in order to fit a circuit board populated with LEDs into a smaller housing, it is common to manipulate the legs of the LEDs until the LEDs are oriented approximately parallel to the remainder of the circuit board. However, the legs are weakened and may become susceptible to breaking when so manipulated. Furthermore, and perhaps more importantly, manipulating the legs in this manner may stress the LED itself and/or damage the internal components of the LED or its housing. Accordingly, there remains a need for a circuit board populated with LEDs that is suitable for a compact configuration of an illumination device.

SUMMARY OF THE INVENTION

The present invention is a tabbed circuit board populated with electrical components and method for manufacturing same.

An exemplary tabbed circuit board made in accordance with the present invention includes a flexible substrate of a predetermined length, having a first lateral edge and a second lateral edge. The flexible substrate further has a plurality of integral tabs arrayed along the first lateral edge. A conductive trace is applied to the flexible substrate. The exemplary circuit board receives and is populated with a plurality of electrical components, for example, light-emitting diodes (LEDs), which are electrically connected to the conductive trace. Specifically, each individual LED is connected to the conductive trace at a respective integral tab. The integral tabs are initially aligned with the remainder of the substrate, i.e., in a first position.

The integral tabs can then be manipulated from the first position to a second position, in which each tab is oriented at an angle (for example, substantially perpendicular) relative to the remainder of the substrate. By manipulating the tabs from the first position to the second position in this manner, there is neither bending nor other manipulation of the legs of the LEDs. Accordingly, no stresses are applied to the legs of the LEDs, preventing any weakening of the legs that might make them susceptible to breaking, while also eliminating the possibility of stressing the LED itself and/or damaging the internal components of the LED or its housing. Manipulating all the tabs to the second position allows the exemplary circuit board to have a more compact profile. Thus, the tabbed circuit board can be fit into a smaller housing or a more confined space.

A method for manufacturing a tabbed circuit board in accordance with the present invention thus includes the steps of: providing a flexible substrate having a predetermined length with integral tabs arrayed along a lateral edge of the substrate; applying a conductive trace to the flexible substrate; populating the circuit board with a plurality of electrical components (such as LEDs) by operably connecting one or more electrical components to the conductive trace at a respective integral tab; and manipulating the integral tabs from a first position in which the tabs are aligned with the remainder of the substrate to a second position in which the tabs are oriented at an angle (for example, substantially perpendicular) relative to the remainder of the substrate.

DESCRIPTION OF THE DRAWINGS

FIG. 1 is a partial plan view of an exemplary circuit board made in accordance with the present invention;

FIG. 2 is a partial plan view of the exemplary circuit board of FIG. 1, after it has been populated with a plurality of electrical components;

FIG. 2A is a view of the exemplary circuit board taken along line 2A-2A of FIG. 2.

DETAILED DESCRIPTION OF THE INVENTION

Figure 3A:
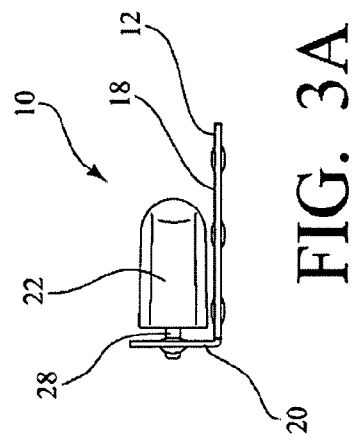
FIG. 3A is a view of the exemplary circuit board taken along line 3A-3A of FIG. 3.

The present invention is a tabbed circuit board populated with electrical components and method for manufacturing same.

FIG. 1 is a partial plan view of an exemplary tabbed circuit board 10 made in accordance with the present invention. The tabbed circuit board 10 includes a flexible substrate 12 of a predetermined length, having a first lateral edge 14 and a second lateral edge 16. The flexible substrate 12 further has a plurality of integral tabs 20 arrayed along the first lateral edge 14, the importance of which is further described below. A conductive trace 18 is applied to the flexible substrate 12. The conductive trace 18 would commonly be applied by adhering a layer of copper over the substrate 12, and then removing unwanted copper through chemical etching or a similar technique; however, other manufacturing methods could certainly be used to apply the conductive trace 18 without departing from the spirit and scope of the present invention.

Referring now to FIGS. 2 and 2A, the exemplary circuit board 10 receives and is populated with a plurality of electrical components, in this case, light-emitting diodes (LEDs) 22. Each individual LED 22 is operably connected to the conductive trace 18 at a respective integral tab 20. Specifically, the legs 28 of each LED 22 are soldered or similarly electrically connected to the conductive trace 18 at a respective integral tab 20. Of course, multiple electrical components could be electrically connected to the conductive trace 18 at each integral tab 20 without departing from the spirit and scope of the present invention. In any event, as shown in FIGS. 2 and 2A, the integral tabs 20 are aligned with the remainder of the substrate 12, i.e., in a first position.

Figure 3:
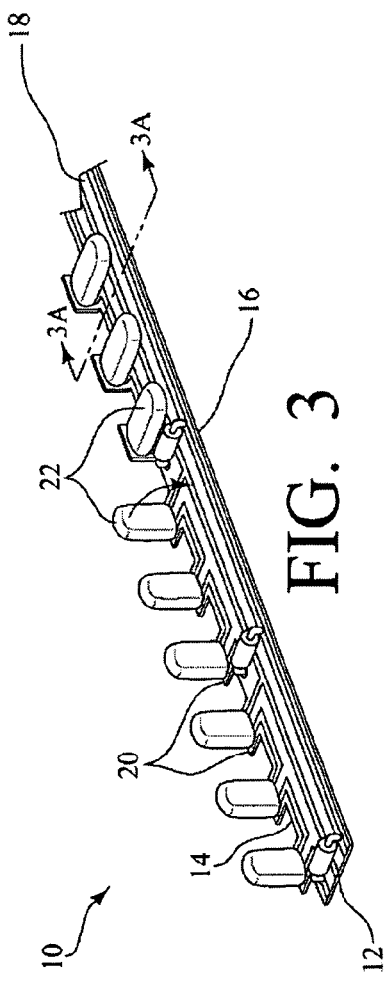
FIG. 3 is a partial perspective view of the exemplary circuit board of FIG. 2, illustrating the folding of some tabs relative to the remainder of the flexible substrate.

Referring now to FIGS. 3 and 3A, some of the integral tabs 20 have been manipulated from the first position to a second position, in which a tab is oriented at an angle (in this example, substantially perpendicular) to the remainder of the substrate 12. By manipulating the tabs 20 from the first position to the second position in this manner, there is neither bending nor other manipulation of the legs 28 of the LEDs 22. Rather, it is the substrate 12 and conductive trace 18 that is bent and manipulated. Accordingly, no stresses are applied to the legs 28 of the LEDs 22, preventing any weakening of the legs 28 that might make them susceptible to breaking, while also eliminating the possibility of stressing the LED 22 itself and/or damaging the internal components of the LED 22 or its housing.

Similarly, it should be recognized that integral tabs on a circuit board populated with electrical components other than LEDs can be similarly manipulated to a second position to eliminate any manipulation of the legs of such electrical components. In other words, the teachings of the present invention are not limited to a circuit board populated with LEDs, but could also be applied to circuit boards populated with a wide variety of electrical components.

Figure 5:
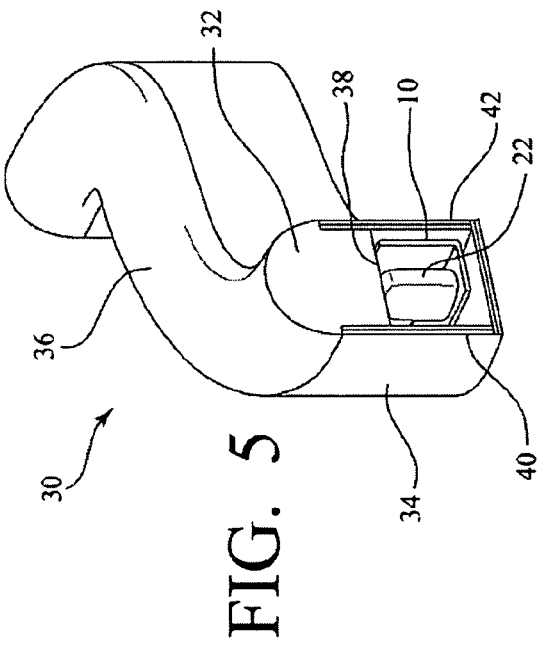
FIG. 5 is a perspective view of the illumination device of FIG. 4.
Figure 4:
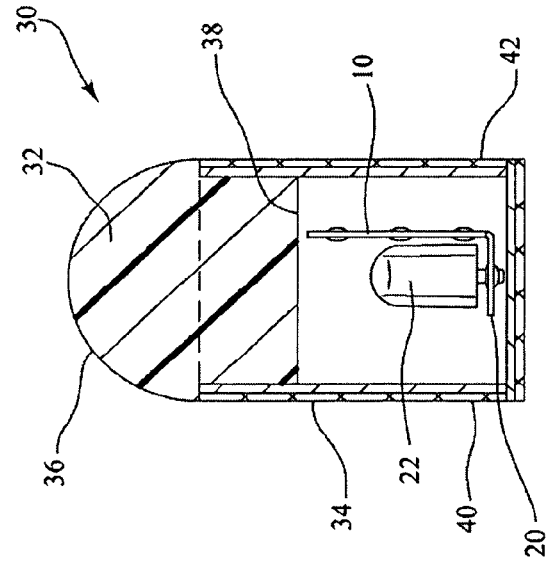
FIG. 4 is an end view of an illumination device incorporating the exemplary circuit board of FIG. 2.

Manipulating all the tabs 20 to the second position allows the exemplary circuit board 10 to have a more compact profile, as illustrated in FIG. 3A. In this manner, the tabbed circuit board 10 can be fit into a smaller housing or a more confined space. For example, the tabbed circuit board 10 can be incorporated into an illumination device for simulating neon lighting, similar to that described in U.S. Pat. Nos. 6,592,238 and 6,953,262. In this regard, FIGS. 4-5 illustrate such an illumination device 30 for simulating neon lighting that incorporates the exemplary tabbed circuit board 10 described above. The illumination device 30 generally comprises the tabbed circuit board 10 populated with a plurality of LEDs 22, a housing 34 for the tabbed circuit board 10 and LEDs 22, and a light-diffusing member 32 for receiving light emitted from the LEDs 22.

In this exemplary embodiment and as described in U.S. Pat. Nos. 6,592,238 and 6,953,262, the light-diffusing member 32 is a rod-like member with a curved surface serving as a light-emitting surface 36 and an internal surface that serves as a light-receiving surface 38. Although such geometry is desirable because it simulates a neon tube, the light-diffusing member 32 could also be produced in various other shapes without departing from the spirit and scope of the present invention. In any event, light entering the light-diffusing member 32 of the illumination device 30 through the light-receiving surface 38 is scattered and diffused so as to be perceived as being substantially uniform over the light-emitting surface 36.

Referring still to FIGS. 4-5, and as mentioned above, the tabbed circuit board 10 populated with a plurality of LEDs 22, along with any other accompanying electrical accessories, is positioned within the housing 34. The housing 34 generally comprises a pair of side walls 40, 42 defining an open-ended channel that extends substantially the length of the light-diffusing member 32. As such, the housing 34 preferably not only functions to house the tabbed circuit board 10 populated with a plurality of LEDs 22, but also to collect light not emitted directly into the light-receiving surface 38 and redirect it to the light-diffusing member 32. As such, the internal surfaces of the side walls 40, 42 and the circuit board 10 may be constructed of or coated with a light-reflecting material (e.g., white paint or tape) in order to increase the light collection efficiency by reflecting the light incident upon the internal surfaces of the housing 34 into the light-diffusing member 32.

Advantageously, with the tabs 20 of the circuit board 10 manipulated into the second position, the side walls 40, 42 can be spaced closer to each other and still be able to accommodate the tabbed circuit board 10 and the LEDs 22. In this manner, the exemplary circuit board 10 can be fit into a much smaller housing.

A method for manufacturing a tabbed circuit board 10 in accordance with the present invention thus includes the steps of: providing a flexible substrate 12 having a predetermined length with integral tabs arrayed along a lateral edge 14 of the substrate 12; applying a conductive trace 18 to the flexible substrate 12; populating the circuit board 10 with a plurality of electrical components (such as LEDs) 22 by operably connecting one or more electrical components 22 to the conductive trace 18 at a respective integral tab 20; and manipulating the integral tabs 20 from a first position in which the tabs 20 are aligned with the remainder of the substrate 12 to a second position in which the tabs 20 are oriented at an angle (for example, substantially perpendicular) relative to the remainder of the substrate 12.

One of ordinary skill in the art will also recognize that additional embodiments are possible without departing from the teachings of the present invention or the scope of the claims which follow. This detailed description, and particularly the specific details of the exemplary embodiments disclosed herein, is given primarily for clarity of understanding, and no unnecessary limitations are to be understood therefrom, for modifications will become obvious to those skilled in the art upon reading this disclosure and may be made without departing from the spirit or scope of the claimed invention.

What is claimed is:

1. A circuit board for receiving and operably connecting a plurality of electrical components, comprising:
    a flexible substrate of a predetermined length and having a first lateral edge and a second lateral edge;
    a conductive trace applied to said flexible substrate; and
    a plurality of integral tabs arrayed along the first lateral edge, one or more electrical components being operably connected to said conductive trace at a respective tab;
    wherein each said tab can be manipulated from a first position in which said tab is aligned with the remainder of said substrate to a second position in which said tab is oriented at an angle relative to the remainder of said substrate.

2. The circuit board as recited in claim 1, wherein said electrical components are light-emitting diodes.

3. The circuit board as recited in claim 1, wherein, in the second position, said tab is oriented substantially perpendicular to the remainder of said substrate.

4. An illumination device, comprising:
    a plurality of light-emitting diodes;
    a light-diffusing member for receiving light emitted from said light-emitting diodes; and
    a tabbed circuit board for receiving said light-emitting diodes and including
        a flexible substrate of a predetermined length and having a first lateral edge and a second lateral edge,
        a conductive trace applied to said flexible substrate, and a plurality of integral tabs arrayed along the first lateral edge, one or more electrical components being operably connected to said conductive trace at a respective tab, wherein each said tab can be manipulated from a first position in which said tab is aligned with the remainder of said substrate to a second position in which said tab is oriented at an angle relative to the remainder of said substrate.

5. The illumination device as recited in claim 4, and further comprising a housing that receives said light-emitting diodes and any accompanying electrical accessories.

6. The illumination device as recited in claim 5, in which said housing generally comprises a pair of side walls that define an open-ended channel, with said circuit board being received and housed in said open-ended channel.

7. The illumination device as recited in claim 6, in which internal surfaces of said side walls are constructed of or coated with a light-reflecting material.

8. The illumination device as recited in claim 6, wherein, in the second position, said tab is oriented substantially perpendicular to the remainder of said substrate.

* * * * *